United States Patent
Ko et al.

(10) Patent No.: US 10,796,910 B2
(45) Date of Patent: *Oct. 6, 2020

(54) METHOD FOR PERFORMING A PHOTOLITHOGRAPHY PROCESS

(71) Applicant: TAIWAN SEMICONDUCTOR MANUFACTURING CO., LTD., Hsinchu (TW)

(72) Inventors: Tsung-Han Ko, New Taipei (TW); Joy Cheng, Taoyuan (TW); Ching-Yu Chang, Yuansun Village, Yilang County (TW); Chin-Hsiang Lin, Hsinchu (TW)

(73) Assignee: Taiwan Semicondutor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/731,664

(22) Filed: Dec. 31, 2019

(65) Prior Publication Data

US 2020/0135452 A1    Apr. 30, 2020

Related U.S. Application Data

(63) Continuation of application No. 15/906,187, filed on Feb. 27, 2018, now Pat. No. 10,573,519.

(Continued)

(51) Int. Cl.
*H01L 21/027* (2006.01)
*G03F 7/26* (2006.01)
(Continued)

(52) U.S. Cl.
CPC .......... *H01L 21/0274* (2013.01); *G03F 7/038* (2013.01); *G03F 7/039* (2013.01); *G03F 7/0392* (2013.01); *G03F 7/094* (2013.01); *G03F 7/20* (2013.01); *G03F 7/26* (2013.01); *G03F 7/38* (2013.01); *G03F 7/40* (2013.01); *G03F 7/405* (2013.01); *H01L 21/0271* (2013.01);
(Continued)

(58) Field of Classification Search
CPC ........ G03F 7/2006; G03F 7/38; G03F 7/0045; G03F 7/322; G03F 7/325; G03F 7/038; G03F 7/0752; G03F 7/0392; G03F 7/0382; G03F 7/094; G03F 7/405; G03F 7/20; G03F 7/039; G03F 7/40; G03F 7/26; H01L 21/266; H01L 21/027; H01L 29/66795; H01L 21/0274; H01L 21/0273; H01L 21/0337; H01L 21/0271; H01L 21/3086

See application file for complete search history.

(56) References Cited

U.S. PATENT DOCUMENTS 8,764,995 B2    7/2014 Chang et al.
8,796,666 B1    8/2014 Huang et al.
(Continued)

*Primary Examiner* — Savitri Mulpuri
(74) *Attorney, Agent, or Firm* — Birch, Stewart, Kolasch & Birch, LLP

(57) ABSTRACT

A method for performing a photolithography process is provided. The method includes forming a layer over a substrate, and exposing a portion of the layer to form an exposed region. The method also includes performing a baking process on the layer, so that voids are formed in the exposed region of the layer. The method further includes filling the void with a post treatment coating material, and the post treatment coating material is over the exposed region of the layer.

20 Claims, 14 Drawing Sheets

Related U.S. Application Data

(60) Provisional application No. 62/555,872, filed on Sep. 8, 2017.

(51) Int. Cl.
| | | |
|---|---|---|
| *H01L 21/033* | (2006.01) | |
| *H01L 21/308* | (2006.01) | |
| *H01L 21/266* | (2006.01) | |
| *G03F 7/038* | (2006.01) | |
| *G03F 7/20* | (2006.01) | |
| *G03F 7/40* | (2006.01) | |
| *G03F 7/09* | (2006.01) | |
| *G03F 7/039* | (2006.01) | |
| *G03F 7/38* | (2006.01) | |

(52) U.S. Cl.
CPC ...... *H01L 21/0273* (2013.01); *H01L 21/0337* (2013.01); *H01L 21/266* (2013.01); *H01L 21/3086* (2013.01)

(56) References Cited

U.S. PATENT DOCUMENTS

| | | |
|---|---|---|
| 8,828,625 B2 | 9/2014 | Lu et al. |
| 8,841,047 B2 | 9/2014 | Yu et al. |
| 8,877,409 B2 | 11/2014 | Hsu et al. |
| 8,927,437 B2 * | 1/2015 | Ho .............. B05D 1/322 438/758 |
| 9,093,530 B2 | 7/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |
| 9,612,536 B2 | 4/2017 | Liu et al. |
| 9,645,497 B2 | 5/2017 | Chang et al. |
| 9,927,707 B2 | 3/2018 | Liu et al. |
| 9,941,157 B2 | 4/2018 | Lin et al. |
| 9,958,779 B2 | 5/2018 | Lai et al. |
| 10,056,256 B2 | 8/2018 | Lai et al. |
| 10,082,734 B2 | 9/2018 | Su et al. |
| 10,096,481 B1 | 10/2018 | Lin et al. |
| 10,115,585 B2 | 10/2018 | Liu et al. |
| 10,394,123 B2 | 8/2019 | Wang et al. |
| 10,394,126 B2 | 8/2019 | Cheng et al. |
| 2006/0154185 A1 | 7/2006 | Ho et al. |
| 2007/0077516 A1 | 4/2007 | Chang |
| 2008/0076038 A1 | 3/2008 | Chang et al. |
| 2011/0008968 A1 | 1/2011 | Chang |
| 2011/0097670 A1 | 4/2011 | Wang et al. |
| 2013/0323641 A1 | 12/2013 | Chang |
| 2016/0379874 A1 * | 12/2016 | Lin ............ H01L 21/76837 257/770 |
| 2018/0138034 A1 | 5/2018 | Lin et al. |
| 2018/0348639 A1 | 12/2018 | Liu et al. |
| 2019/0043710 A1 | 2/2019 | Chen et al. |

* cited by examiner

METHOD FOR PERFORMING A PHOTOLITHOGRAPHY PROCESS

CROSS REFERENCE TO RELATED APPLICATIONS

This Application is a Continuation application of U.S. patent application Ser. No. 15/906,187, filed on Feb. 27, 2018, which claims the benefit of U.S. Provisional Application No. 62/555,872 filed on Sep. 8, 2017, and entitled "Method for performing a photolithography process with post treatment", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

Lithography processes are extensively utilized in integrated circuit (IC) manufacturing, and various IC patterns are transferred to a workpiece to form an IC device. Since feature sizes continue to decrease, fabrication processes continue to become more difficult to perform. Accordingly, although existing lithography techniques have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 3E' shows a cross-sectional representation of the exposed region of the resist layer, in accordance with some embodiments of the disclosure.

FIG. 4G' shows cross-sectional representations of the exposed region of the resist layer, in accordance with some embodiments of the disclosure.

DETAILED DESCRIPTION

Figure 1A:
FIGS. 1A-1I show cross-sectional representations of various stages of performing a photolithography process, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, so that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for a semiconductor structure and method for forming the same are provided. FIGS. 1A-1I show cross-sectional representations of various stages of performing a photolithography process, in accordance with some embodiments of the disclosure. In some embodiments, the photolithography process is used in a negative tone development (NTD) process. "Negative tone development (NTD) processes" have been used to pattern material layers. The resist layer is exposed by a light source, followed by post-exposure baking. A portion of the composition of the exposed region of the resist layer is changed, and it is more difficult to dissolve this portion in the NTD solvent. When the resist layer is developed, only the unexposed region of the resist layer is washed away.

Referring to FIG. 1A, a substrate 102 is provided. The substrate 102 may be made of silicon or another semiconductor material. In some embodiments, the substrate 102 is a wafer. Alternatively or additionally, the substrate 102 may include other elementary semiconductor materials such as germanium. In some embodiments, the substrate 102 is made of a compound semiconductor or alloy semiconductor, such as silicon carbide, gallium arsenic, indium arsenide, or indium phosphide, silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

Some device elements may be formed over the substrate 102. Examples of such device elements include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc.), diodes, and other applicable elements. Various processes are performed to form device elements, such as deposition, etching, implantation, photolithography, annealing, and other applicable processes.

The substrate 102 may include various doped regions such as p-type wells or n-type wells). Doped regions may be doped with p-type dopants, such as boron or $BF_2$, and/or n-type dopants, such as phosphorus (P) or arsenic (As). In some other embodiments, the doped regions may be formed directly on the substrate 102.

The substrate 102 also includes isolation structures (not shown). The isolation structure is used to define and electrically isolate various devices formed in and/or over the substrate 102. In some embodiments, the isolation structure includes shallow trench isolation (STI) structure, local oxidation of silicon (LOCOS) structure, or another applicable isolation structure. In some embodiments, the isolation structure includes silicon oxide, silicon nitride, silicon oxynitride, fluoride-doped silicate glass (FSG), or another suitable material.

Next, a material layer 104 is formed over the substrate 102. The material layer 104 is configured to be patterned or doped in subsequent manufacturing processes. The material layer 104 may be one or more material layers. In some embodiments, the material layer 104 includes a silicon layer, a dielectric layer, and/or a doped poly-silicon layer.

Figure 1B:
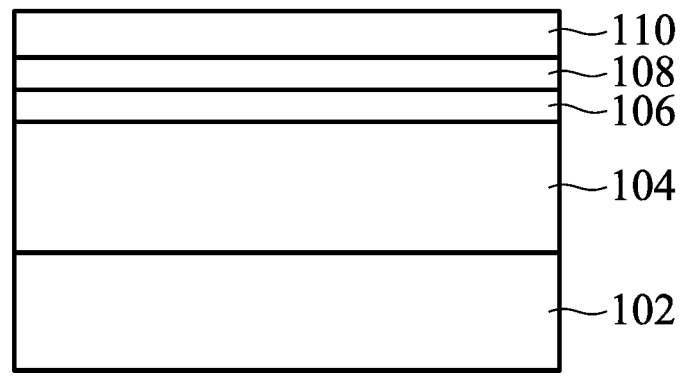

Afterwards, as shown in FIG. 1B, a bottom layer 106 is formed over the material layer 104, in accordance with some embodiments of the disclosure. The bottom layer 106 may be a first layer of a tri-layer resist layer (also referred to as tri-layer photoresist). The bottom layer 106 may contain a material that is patternable and/or have anti-reflection properties. In some embodiments, the bottom layer 106 is a bottom anti-reflective coating (BARC) layer. In some embodiments, the bottom layer 106 includes a carbon backbone polymer. In some embodiments, the bottom layer 106 is made of a silicon-free material. In some embodiments, the bottom layer 106 is formed by a spin-on coating process, a chemical vapor deposition process (CVD), a physical vapor deposition (PVD) process, or another suitable deposition process.

A middle layer 108 is formed over the bottom layer 106. The middle layer 108 may have a composition that provides anti-reflective properties and/or hard mask properties for the photolithography process. In addition, the middle layer 108 is designed to provide etching selectivity from the bottom layer 106 and a resist layer 110. In some embodiments, the middle layer 108 is made of silicon nitride, silicon oxynitride or silicon oxide.

A resist layer 110 is formed over the middle layer 108. The resist layer 110 may be positive photoresist or negative photoresist. In some embodiments, the top layer 110 includes a carbon backbone polymer. In some embodiments, the resist layer 110 is a chemical amplified (CA) resist. In some embodiments, the resist layer 110 is made of Poly (methyl methacrylate) (PMMA), Poly (methyl glutarimide) (PMGI), Phenol formaldehyde resin (DNQ/Novolac), SU-8 or another applicable material. The resist layer 110 further includes a photo-acid generator (PAG). When the resist layer 110 is exposed to radiation (e.g. light), the PAG forms a small amount of acid. The PAG may have a concentration ranging between about 1% and 30% of the weight of the resist layer 110.

Figure 1C:
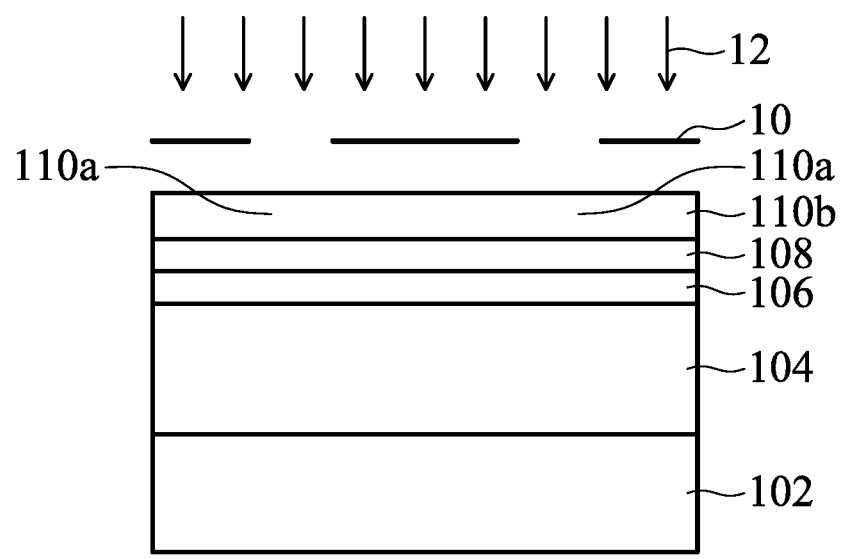

Afterwards, as shown in FIG. 1C, a mask 10 is formed over the resist layer 110, and an exposure process 12 is performed on the resist layer 110, in accordance with some embodiments of the disclosure. As a result, an exposed region 110a and an unexposed region 110b are formed.

In some embodiments, a negative tone developer (NTD) process is performed, the exposed region 110a of the resist layer 110 remains, and the unexposed region 110b of the resist layer 110 is removed by the first developer.

The radiation energy of the exposure process 12 may include a 248 nm beam by Krypton Fluoride (KrF) excimer lasers, a 193 nm beam by Argon Fluoride (ArF) excimer lasers, a 157 nm beam by Fluoride (F2) Excimer Lasers, or Extreme ultra-violet (EUV) light, such as EUV light with wavelength of about 13.5 nm.

Figure 1D:
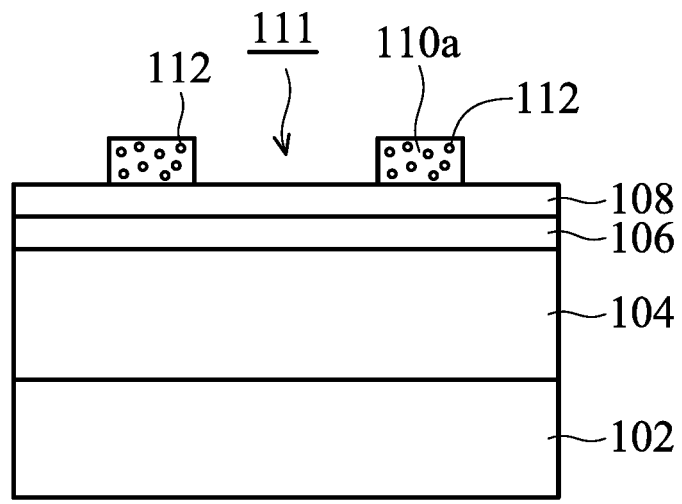

Afterwards, as shown in FIG. 1D, the resist layer 110 is developed by performing a first develop process to form a patterned top layer 110a, in accordance with some embodiments of the disclosure. A portion of the resist layer 110 is removed by the first developer. The exposed region 110a of the resist layer 110 is left and the unexposed region 110a of the resist layer 110 is removed by the first developer. A recess 111 is formed between two adjacent exposed regions 110a of the resist layer 110.

The first developer may be an organic solvent. In some embodiments, the first developer includes methyl amyl ketone (MAK), n-butyl acetate (nBA), n-pentylacetate (nPA), ethyl amyl ketone (EAK), or a combination thereof.

Figure 2A:
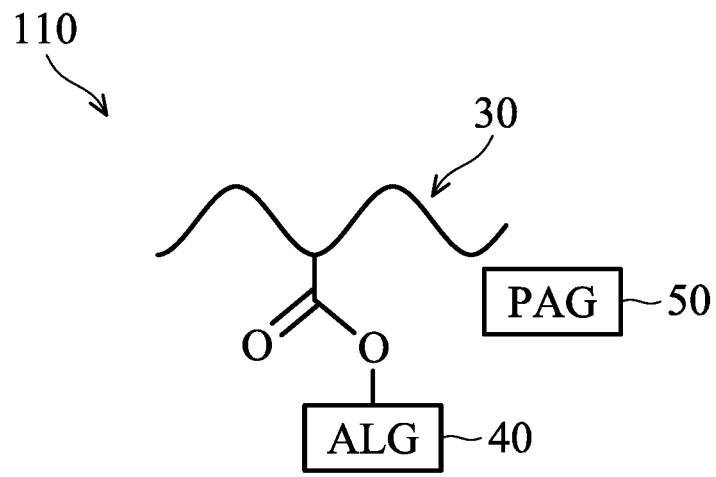
FIG. 2A shows a diagrammatical view of a chemical structure of the resist layer, in accordance with some embodiments.
Figure 2B:
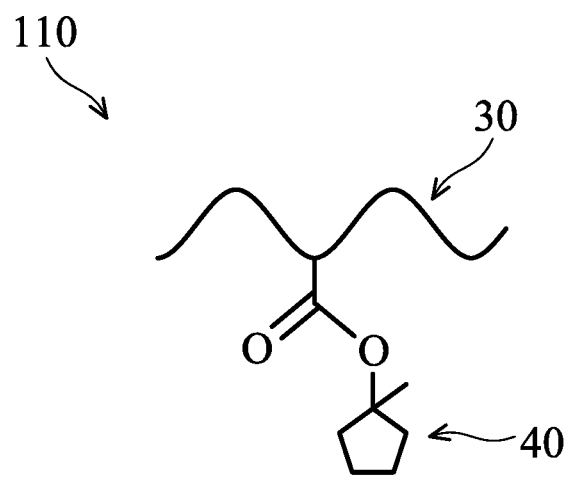
FIGS. 2B and 2C show chemical structures of an exemplary ALG, in accordance with some embodiments.
Figure 2C:
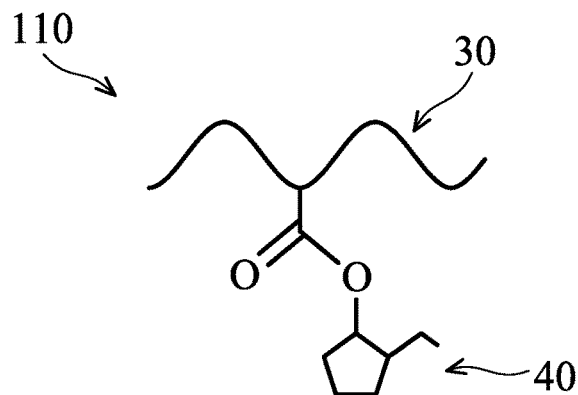

FIG. 2A shows a diagrammatical view of a chemical structure of the resist layer 110, in accordance with some embodiments. FIGS. 2B and 2C show chemical structures of an exemplary ALG, in accordance with some embodiments.

As shown in FIG. 2A, the resist layer 110 includes a polymer 30, an acid labile group (ALG) 40 and a photoacid generator (PAG) 50. The PAG 50 generates acid when the resist layer 110 is exposed to the radiation energy and absorbs the radiation. The acid labile group (ALG) 40 cleaves from the polymer 30 when the resist layer 110 is in the acidic environment. In other words, the PAG 50 catalyzes cleaving of ALG 40 from the polymer 30 when the resist layer 110 is exposed to radiation. As a result, the polarity and/or solubility of the exposed region 110a of the resist layer 110 is changed.

In embodiments as shown in FIG. 2B, the ALG 40 is methlycyclopentyl (MCP) bonded to a carboxyl group of the polymer 30 by covalent bonding. In embodiments as shown in FIG. 2C, the ALG 40 is ethylcyclopentyl bonded to a carboxyl group of the polymer 30 by covalent bonding.

In some embodiments, the PAG 50 includes a fluorine-containing functional group, such as perfluorosulfonate, diphenyliodonium trifluoromethane sulfonate, diphenyliodonium nonafluorobutane sulfonate, triphenylsulfonium trifluromethane sulfonate, triphenylsulfonium nonafluorobutane sulfonate, triphenylsulfonium bis(perfluoromethanesulfonyl) imide, fluorine-containing functional group, or a combination thereof. In some implementations, PAG 50 includes a phenyl ring based functional group, a heterocyclic ring based functional group, other suitable functional group, or a combination thereof.

Figure 2D:
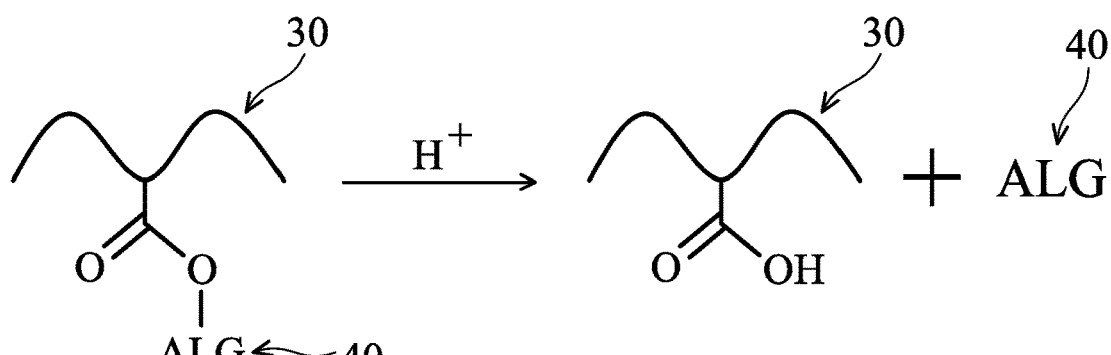
FIG. 2D shows a schematic diagram that shows a reaction occurring in a resist layer when the exposure process is performed in a photolithography process, in accordance with some embodiments.

FIG. 2D shows a schematic diagram that shows a reaction occurring in a resist layer 110 when the exposure process 12 is performed on the resist layer 110, in accordance with some embodiments.

As shown in FIG. 2D, after the ALG 40 is released from the polymer 30 of the resist layer 110, the carboxylic acid group is formed in the polymer 30. After the exposing process, a post-exposure-baking (PEB) process is performed on the resist layer 110. The leaving ALG 40 will be released into the air during baking or rinsed away during the first develop process (performed later). As a result, some voids 112 (shown in FIG. 1D) are formed in the exposed region 110a of the resist layer 110 since the PEB process or the first develop process produces outgassing of the acid labile group (ALG) 40.

In some embodiments, the PEB process is performed at a temperature in a range from about 80 degrees to about 160 degrees. In some embodiments, the PEB process is performed for a period of time ranging from about 5 seconds to about 60 seconds.

Figure 1E:
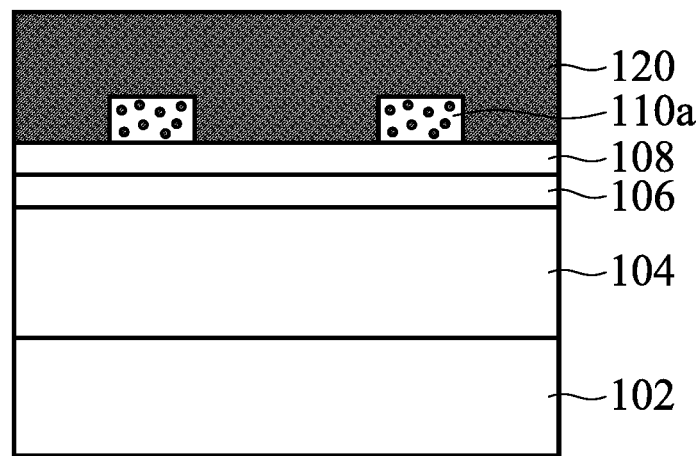

Next, as shown in FIG. 1E, a first post treatment coating material 120 is formed in the recess 111 and the voids 112, and over the surfaces of the exposed region 110a of the resist layer 110, in accordance with some embodiments. More specifically, the first post treatment coating material 120 covers the top surface and sidewall surfaces of the exposed region 110a of the resist layer 110. Since the first post treatment coating material 120 is in liquid form, it flows into the voids 112 of the exposed region 110a of the resist layer 110.

The first post treatment coating material 120 is configured to repair the voids 112 and prevent pattern collapse. In addition, the first post treatment coating material 120 is configured to improve the surface roughness of the resist layer 110. Therefore, the line width roughness (LWR) of the exposed region 110a of the resist layer 110 is improved.

In some embodiments, a post treatment process is performed on the first post treatment coating material 120 after forming the first post treatment coating material 120 and before removing a portion of the post treatment coating material. The post treatment process is configured to seed up the outgassing of the solvent in the first post treatment coating material 120. The post treatment process includes a radiation curing process, a thermal baking process or a combination thereof. In some embodiments, the post treatment process is performed at a temperature in a range from about 80 degrees to about 160 degrees. In some embodiments, the post treatment process is performed for a period of time ranging from about 60 seconds to about 120 seconds.

Figure 2E:
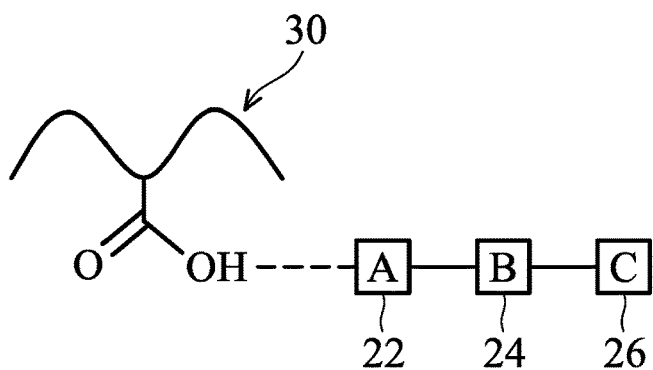
FIG. 2E shows a schematic diagram that shows the arrangement of the polymer of the resist layer and the first post treatment coating material, in accordance with some embodiments.

FIG. 2E shows a schematic diagram that shows the arrangement of the polymer 30 of the resist layer 110 and the first post treatment coating material 120, in accordance with some embodiments.

As shown in FIG. 2E, the first post treatment coating material 120 includes a first segment 22 and a second segment 24 linked to the first segment 22. In some other embodiments, the first post treatment coating material 120 further includes a third segment 26 liked to the second segment 24.

The first segment 22 (labeled as "A") is configured to form a physical bond or a chemical bond with the exposed region 110a of the resist layer 110. The first segment 22 (labeled as "A") includes a halogen atom, hydroxy group, amine group, sulfo group, or carboxyl group. In some embodiments, the first segment 22 is an amine group.

The second segment 24 (labeled as "B") is configured to increase the etching resistance of the first post treatment coating material 120. The second segment 24 (labeled as "B") includes substituted or unsubstituted linear, branched, or cyclic hydrocarbon group, or substituted or unsubstituted aromatic group, and/or at least one hydrogen of the unsubstituted linear, branched, or cyclic hydrocarbon group is substituted by halogen, hydroxyl, sulfo or carboxyl. In some embodiments, the second segment 22 is substituted or unsubstituted C3-C10 alkylene. In some embodiments, the second segment 22 is phenylene.

The third segment 26 (labeled as "C") is configured to increase the etching resistance and the resist contrast of the exposed region 110a of the resist layer 110. The third segment 26 (labeled as "C") includes hydrophobic part or hydrophilic part. The hydrophobic part may include substituted or unsubstituted linear, branched, or cyclic hydrocarbon group, and/or at least one hydrogen of the unsubstituted linear, branched, or cyclic hydrocarbon group is substituted by halogen, hydroxyl, sulfo or carboxyl. The hydrophilic part may include carboxyl group or silxane group. In some embodiments, the third segment 26 is hydrocarbon group.

In some embodiments, the first post treatment coating material 120 includes formula (I), formula (II) or formula (III) as followings. In the formula (I), the first post treatment coating material 120 includes the first segment 22 and the second segment 24. In the formula (II) and (III), the first post treatment coating material 120 includes first segment 22, the second segment 24 and the third segment 26.

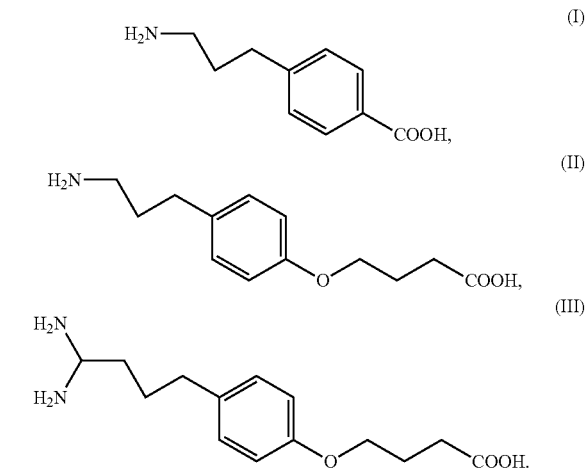

Figure 1F:
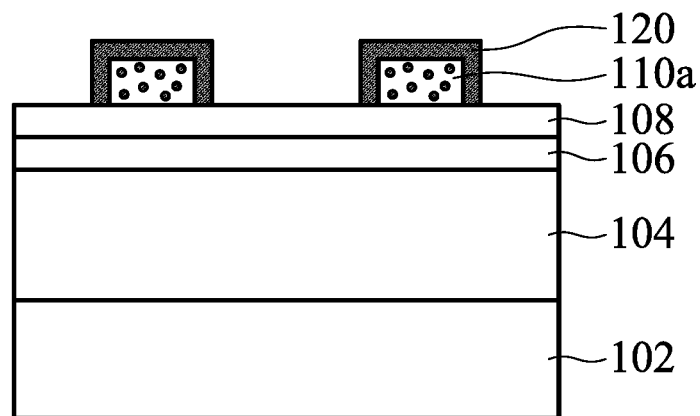

Next, as shown in FIG. 1F, a portion of the first post treatment coating material 120 is removed by performing a second develop process, in accordance with some embodiments. A second developer is used in the second develop process. As a result, another portion of the first post treatment coating material 120 is left on the top surface and sidewall surfaces of the exposed region 110a of the resist layer 110. In some embodiments, the second developer is different from the first developer. In some embodiments, the second developer includes polar solvent (such as water, IPA, methyl isobutyl carbinol (MIBC), alcohol) or organic solvent (such as PGMEA (propylene glycol monomethyl ether acetate) or PGME (propylene glycol monomethyl ether).

Since there is a physical bond or a chemical bond between the exposed region 110a of the resist layer and the first segment 22, a thin film is formed and left on the top surface and sidewall surfaces of the exposed region 110a of the resist layer 110. In some embodiments, the remaining first post treatment coating material 120 has a thickness in a range from about 0.1 nm to about 5 nm. As a result, a patterned resist layer 110a is formed as illustrated in FIG. 1F.

Figure 1G:
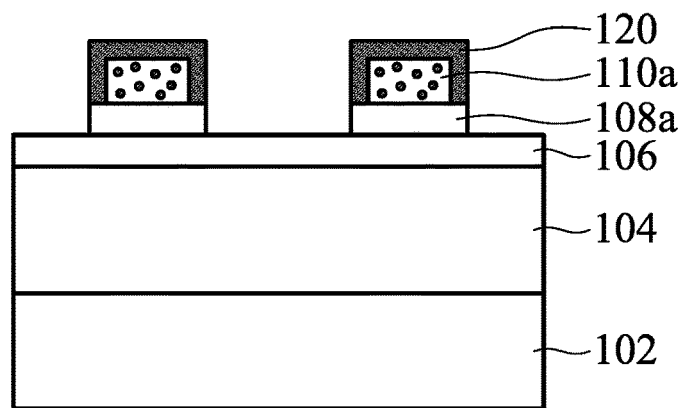

Afterwards, as shown in FIG. 1G, the middle layer 108 is patterned by using the patterned resist layer 110a as a mask to form a patterned middle layer 108a, in accordance with some embodiments.

In some embodiments, the patterned resist layer 110a is removed. In some embodiments, the patterned resist layer 110a is removed by a wet etching process using a polar solvent. The exposed region 110a of the resist layer 110 become hydrophic since ALG 40 is released from the polymer 30 to form carboxylic acid group (shown in FIG. 2D). Therefore, the exposed region 110a of the resist layer 110 is removed by the polar solvent.

Figure 1H:
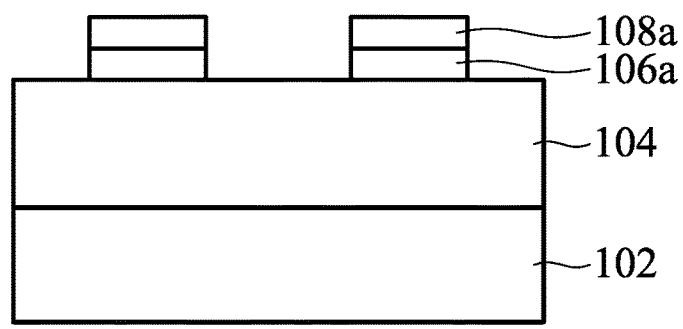

Next, as shown in FIG. 1H, a portion of the bottom layer 106 is removed by using the patterned middle layer 108a as a mask to form a patterned bottom layer 106a, in accordance with some embodiments of the disclosure. As a result, the pattern of the patterned middle layer 108a is transferred to the bottom layer 106.

Figure 1I:
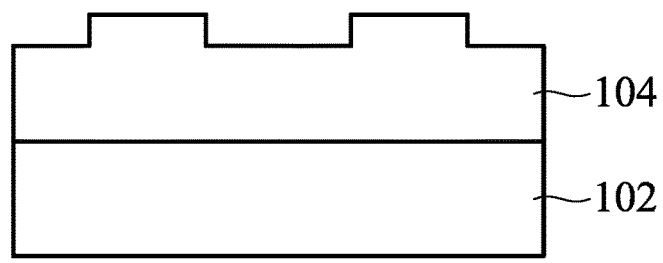

Next, as shown in FIG. 1I, an etching process is performed on the material layer 104 by using the patterned middle layer 108a and the patterned bottom layer 106a as a mask, in accordance with some embodiments of the disclosure.

Although the voids 112 are formed in the exposed region 110a of the resist layer 110, the voids 112 are filled with the first post treatment coating material 120 to prevent the pattern of resist layer 110 from collapsing. In addition, the outer sidewall surfaces and the top surface of the exposed region 110a of the resist layer 110 is covered by the first post treatment coating material 120 to improve the line width roughness (LWR). Therefore, the lithography resolution is improved. Furthermore, the first post treatment coating material 120 is configured to increase the etching resistance of the resist layer 110 during patterning the underlying layers which are below the resist layer 110.

FIGS. 3A-3H show cross-sectional representations of various stages of performing a photolithography process, in accordance with some embodiments of the disclosure.

Figure 3A:
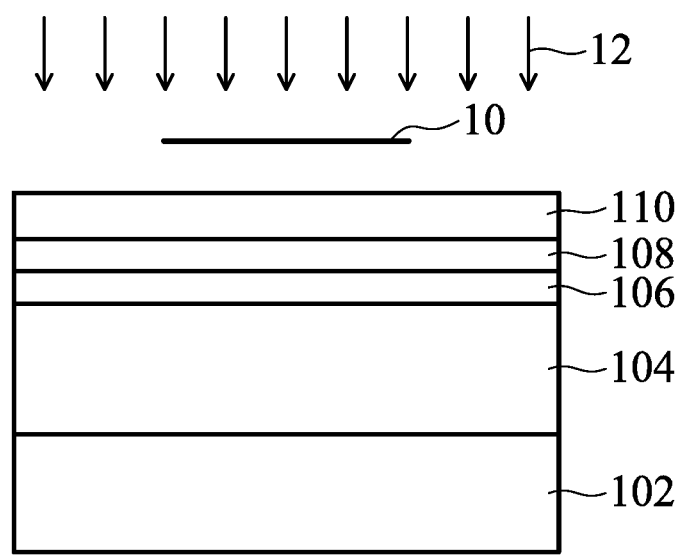
FIGS. 3A-3H show cross-sectional representations of various stages of performing a photolithography process, in accordance with some embodiments of the disclosure.

As shown in FIG. 3A, the mask 10 is formed over the resist layer 110, and the exposure process 12 is performed on the resist layer 110, in accordance with some embodiments of the disclosure.

Figure 3B:
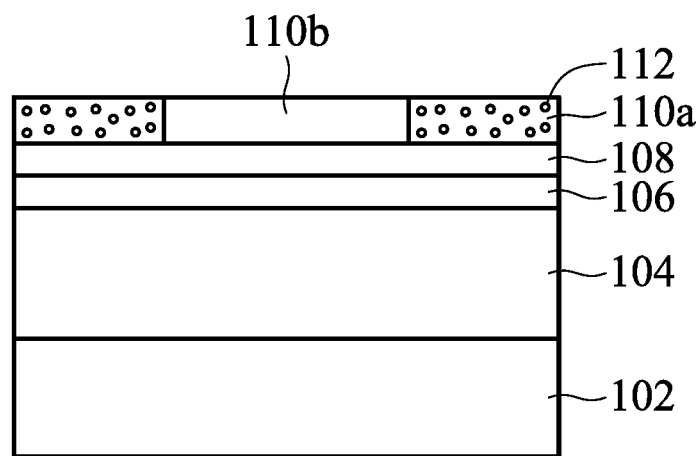

Next, as shown in FIG. 3B, after the exposure process 12, the exposed region 110a and the unexposed region 110b are formed, in accordance with some embodiments of the disclosure. Afterwards, the post-exposure-baking (PEB) process is performed on the resist layer 110. Some voids 112 are formed in the exposed region 110a since the ALG is released from the polymer of the resist layer 110.

Figure 3C:
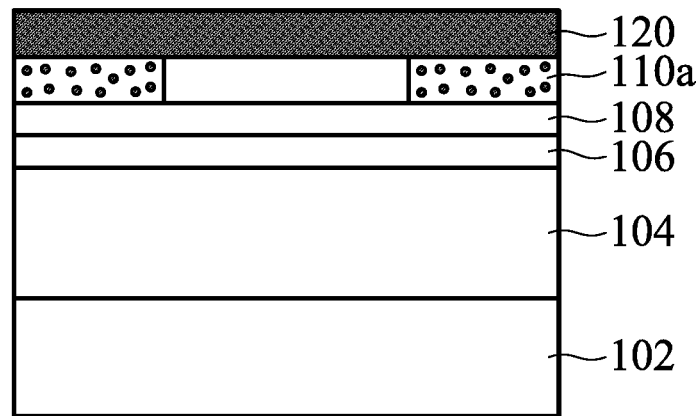

Afterwards, as shown in FIG. 3C, the first post treatment coating material 120 is formed in the voids 112, and over the surfaces of the exposed region 110a and unexposed region 110b of the resist layer 110, in accordance with some embodiments.

Figure 3D:
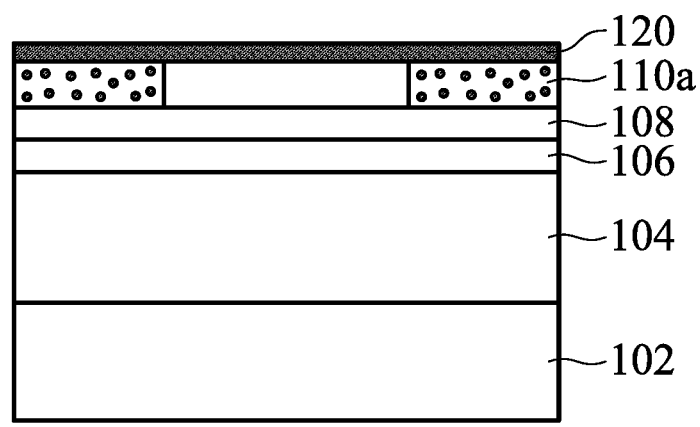

Next, as shown in FIG. 3D, a portion of the first post treatment coating material 120 is removed by a first develop process with a first developer, in accordance with some embodiments. As a result, another portion of the first post treatment coating material 120 is remaining on the surfaces of the surfaces of the exposed region 110a and unexposed region 110b of the resist layer 110 to form a thin film.

Figure 3E:
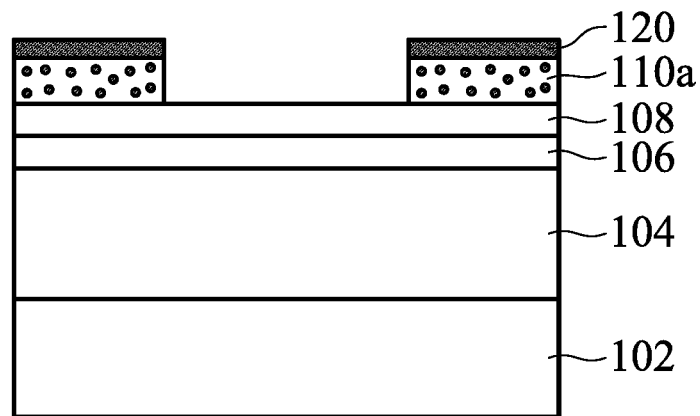
Figure 3E:
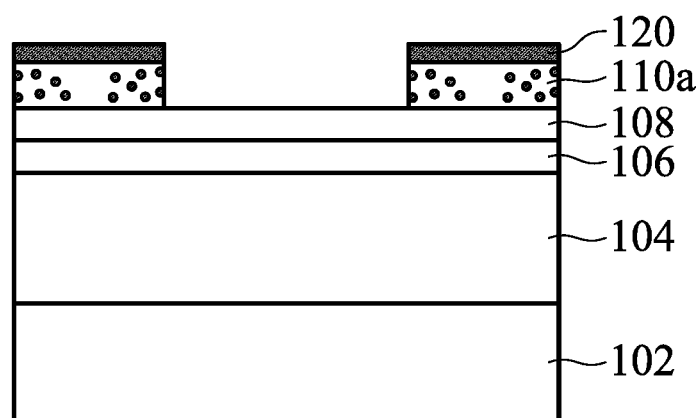

As shown in FIG. 3E, the unexposed region 110b and a portion of the first post treatment coating material 120 formed above the unexposed region 110b are developed by a second develop process with a second developer, in accordance with some embodiments. In some embodiments, the second developer is different from the first developer. As a result, a patterned resist layer 110a is formed.

FIG. 3E' shows a cross-sectional representation of the exposed region 110a of the resist layer 110, in accordance with some embodiments of the disclosure. The voids 112 are formed in the resist layer 110 and on outer sidewall surfaces of the resist layer 110. The voids 112 formed on the outer sidewall surfaces of the resist layer 110 are filled with the first post treatment coating material 120, and therefore the outer surface roughness of the resist layer 110 is improved.

Figure 3F:
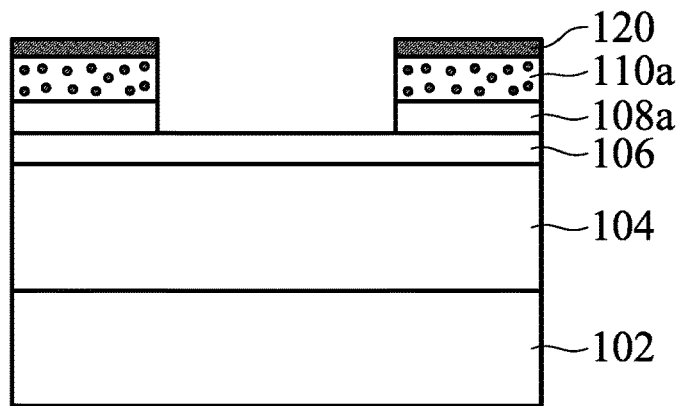

Next, as shown in FIG. 3F, the middle layer 108 is patterned by using the patterned resist layer 110a as a mask to form a patterned middle layer 108a, in accordance with some embodiments.

In some embodiments, the patterned resist layer 110a is removed. In some embodiments, the patterned resist layer 110a is removed by a wet etching process or a dry etching process.

Figure 3G:
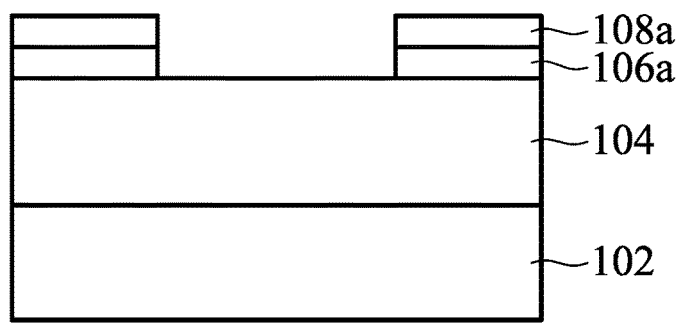

Next, as shown in FIG. 3G, a portion of the bottom layer 106 is removed by using the patterned middle layer 108a as a mask to form a patterned bottom layer 106a, in accordance with some embodiments of the disclosure. As a result, the pattern of the patterned middle layer 108a is transferred to the bottom layer 106.

Figure 3H:
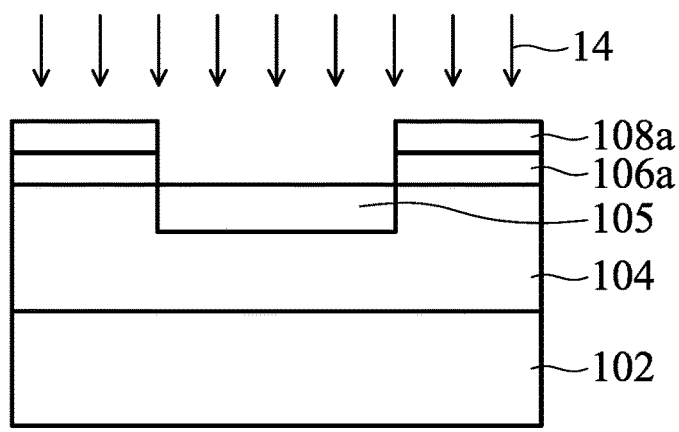

Next, as shown in FIG. 3H, an ion implantation process 14 is performed on the material layer 104 by using the patterned middle layer 108a and the patterned bottom layer 106a as a mask, in accordance with some embodiments of the disclosure. As a result, a portion of the material layer 104 is doped to form a doped region 105 in the material layer 104. The doped region may be doped with p-type dopants, such as boron or $BF_2$, and/or n-type dopants, such as phosphorus (P) or arsenic (As).

In the first embodiments, the unexposed region 110b is removed before forming the first post treatment coating material 120 in the voids 120. In the second embodiments, the voids 112 are filled with the first post treatment coating material 120 before removing the unexposed region 110b. Compared with the first embodiment, the pattern of the resist layer 110 is firstly repaired to further prevent pattern collapse in the second embodiment. The line width roughness (LWR) of the pattern of the resist layer is improved by filling the first post treatment coating material 120 in the voids 112. Therefore, the lithography resolution is improved.

FIGS. 4A-4G show cross-sectional representations of various stages of performing a photolithography process, in accordance with some embodiments of the disclosure.

Figure 4A:
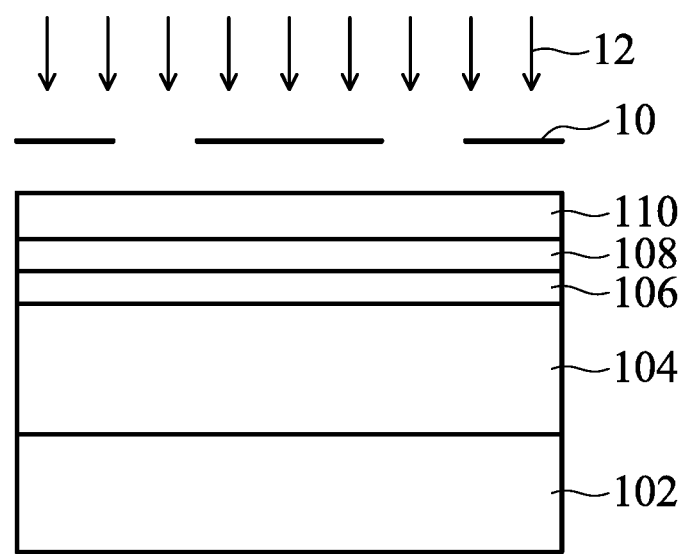
FIGS. 4A-4G show cross-sectional representations of various stages of performing a photolithography process, in accordance with some embodiments of the disclosure.

As shown in FIG. 4A, the mask 10 is formed over the resist layer 110, and the exposure process 12 is performed on the resist layer 110, in accordance with some embodiments of the disclosure.

Figure 4B:
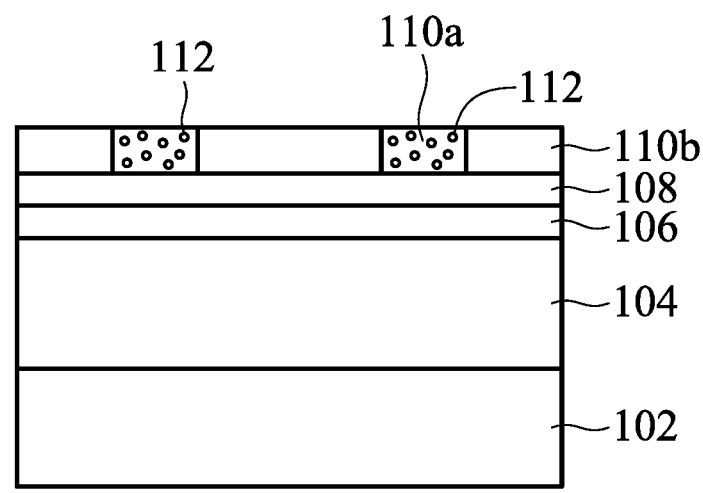

Next, as shown in FIG. 4B, after the exposure process 12, the exposed region 110a and the unexposed region 110b are formed, in accordance with some embodiments of the disclosure. More specifically, the unexposed region 110b is between a first exposed region 110a and a second exposed region 110a. Afterwards, the post-exposure-baking (PEB) process is performed on the resist layer 110. Some voids 112 are formed in the exposed region 110a since the ALG is released from the polymer of the resist layer 110.

Figure 4C:
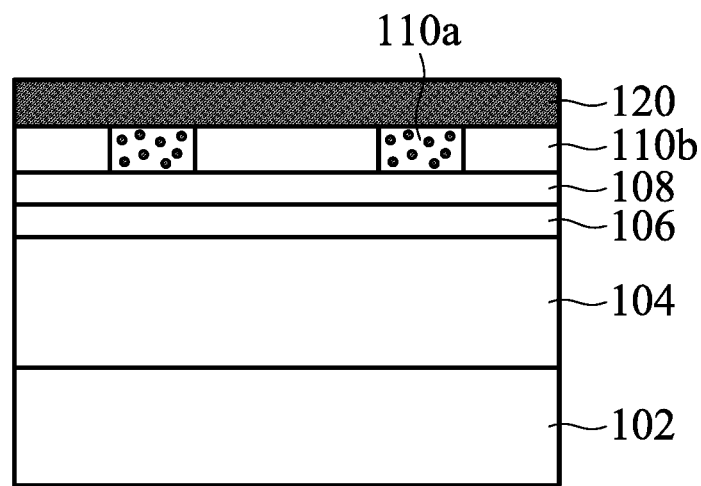

Afterwards, as shown in FIG. 4C, the first post treatment coating material 120 is formed in the voids 112, and over the top surfaces of the exposed region 110a and unexposed region 110b of the resist layer 110, in accordance with some embodiments.

Figure 4D:
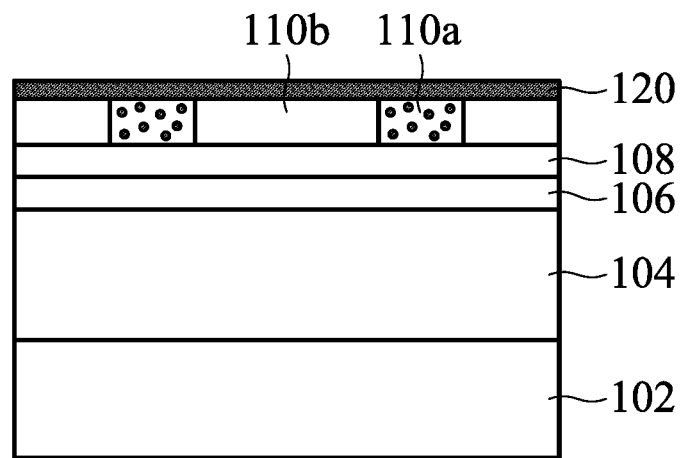

Next, as shown in FIG. 4D, a portion of the first post treatment coating material 120 is removed by a first develop process with a first developer, in accordance with some embodiments. As a result, another portion of the first post treatment coating material 120 is remaining on the surfaces of the surfaces of the exposed region 110a and unexposed region 110b of the resist layer 110 to form a thin film. The thin film is left on the top surface of the exposed region 110a and the top surface of the unexposed region 110b by a physical interaction or a chemical bonding.

Figure 4E:
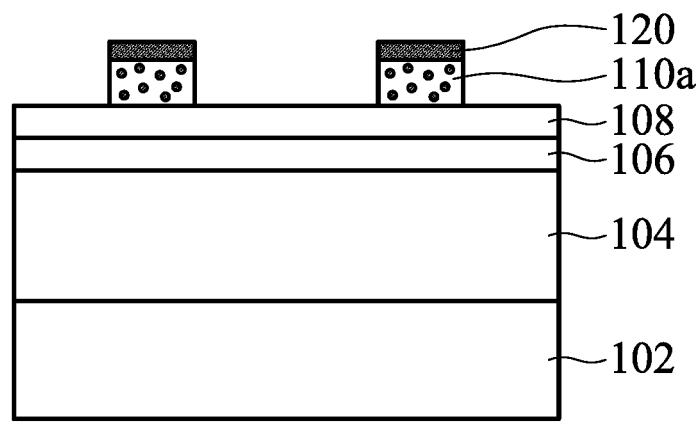

As shown in FIG. 4E, the unexposed region 110b and a portion of the first post treatment coating material 120 formed above the unexposed region 110b are developed by a second develop process with a second developer, in accordance with some embodiments. As a result, a patterned resist layer 110a is formed.

Figure 4F:
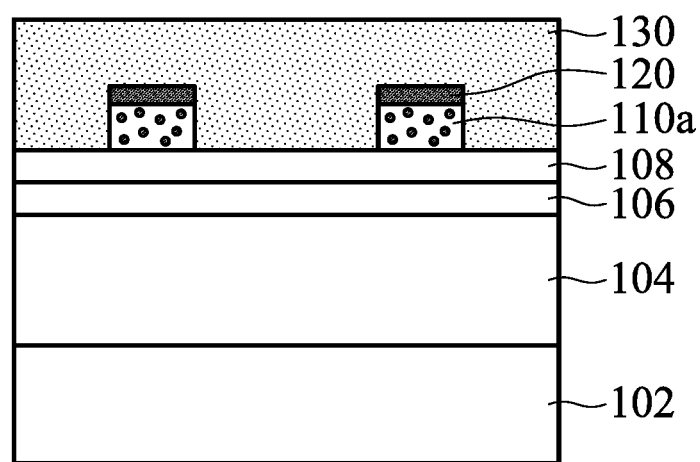

Next, as shown in FIG. 4F, a second post treatment coating material 130 is formed over the first post treatment coating material 120 and over the middle layer 108, in accordance with some embodiments. The second post treatment coating material 130 is used to further repair the surface roughness of the exposed region 110a of the resist layer 110.

Figure 4G:
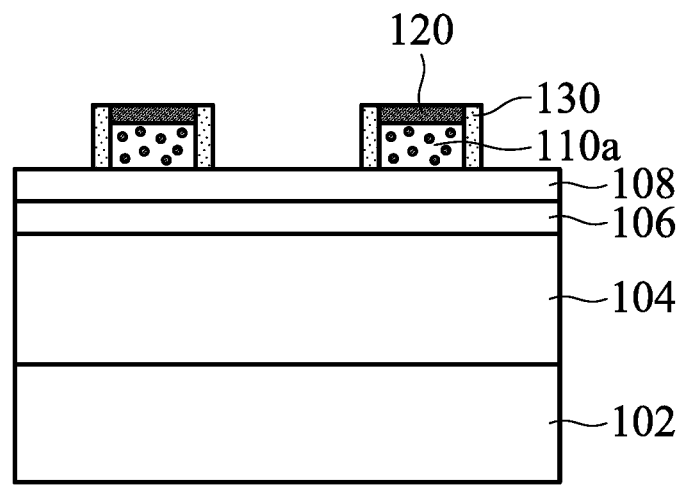
Figure 4G:
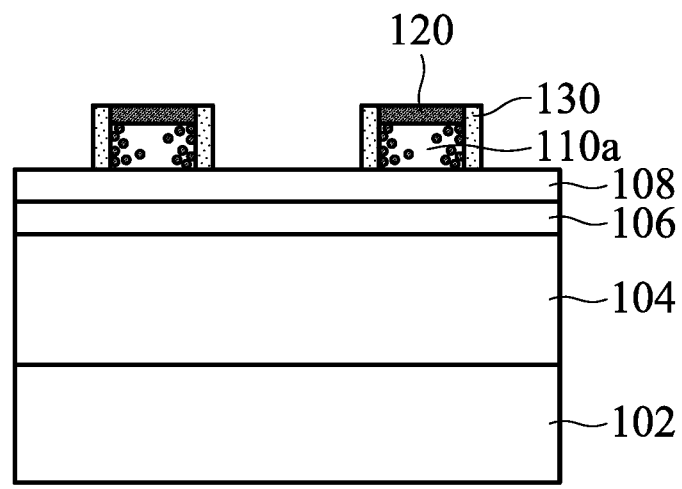

Afterwards, as shown in FIG. 4G, a portion of the second post treatment coating material 130 is removed by a third develop process with a third developer, in accordance with some embodiments. As a result, the sidewall surfaces of the exposed region 110a of the resist layer 110 are covered by the second post treatment coating material 130. The remaining second post treatment coating material 130 has a thickness in a range from about 0.1 nm to about 5 nm.

FIG. 4G' shows cross-sectional representations of the exposed region 110a of the resist layer 110, in accordance with some embodiments of the disclosure. The voids 112 are formed in the resist layer 110 and on sidewall surfaces of the resist layer 110. The voids 112 formed on the sidewall surfaces of the resist layer 110 is filled with the first post treatment coating material 120, and the second post treatment coating material 130 is formed over the first post treatment coating material 120. It should be noted that the second post treatment coating material 130 is formed over sidewall surfaces of the exposed region 110a of the resist layer 110, but is not formed over the top surface of the exposed region 110a of the resist layer 110 since a thin film made of the first post treatment coating material 120 is already formed on the top surface.

The second post treatment coating material 130 is formed on outer sidewall surfaces of the first post treatment coating material 120 to further repair the surface roughness. Therefore, the line width roughness (LWR) of the pattern of the resist layer 110 is improved by using the first post treatment coating material 120 and the second post treatment coating material 130. Therefore, the lithography resolution is improved.

Embodiments for performing a photolithography process are provided. A tri-layer photoresist layer is formed over a material layer over a substrate. The tri-layer photoresist layer includes a bottom layer, a middle layer and a resist layer. The tri-layer photoresist layer is used to pattern the underlying material layer and then is removed. The resist layer is exposed to a radiation to form an exposed region and an unexposed region. Afterwards, some voids are formed in the exposed region when a baking process is performed on the resist layer. A first post treatment coating material is formed in the voids to repair the pattern of the resist layer and prevent the pattern collapse. The line width roughness (LWR) of the pattern of the resist layer is improved and therefore the lithography resolution is improved.

In some embodiments, a method for performing a photolithography process is provided. The method includes forming a resist layer over a substrate and exposing a portion of the resist layer to form an exposed region and an unexposed region by performing an exposure process. The method includes performing a baking process on the resist layer, so that voids are formed in the exposed region of the resist layer. The method also includes removing the unexposed region of the resist layer to form a recess in the resist layer by performing a first develop process and filling a post treatment coating material in the recess and the void, and over the exposed region of the resist layer. The method further includes removing a portion of the post treatment coating material by performing a second develop process, and another portion of the post treatment coating material is left on surfaces of the exposed region of the resist layer to form a patterned resist layer.

In some embodiments, a method for performing a photolithography process is provided. The method includes forming a resist layer over a substrate and exposing a portion of the resist layer to form a first exposed region, a second exposed region and an unexposed region between the first exposed region and the second exposed region. The method also includes performing a baking process on the resist layer, so that voids are formed in the first exposed region and the second exposed region. The method further includes forming a post treatment coating material over the first exposed region, the second exposed region, an unexposed region and in the voids and removing a portion of the post treatment coating material by a first developer. The another portion of the post treatment coating material is left on the top surface the first exposed region, the top surface of the second exposed region, and the top surface of the unexposed region. The method includes removing the unexposed region using a second developer, and another portion of the post treatment coating material is left on the top surface of the first exposed region and the top surface of the second exposed region.

In some embodiments, a method for performing a photolithography process is provided. The method includes forming a resist layer over a substrate, and the resist layer includes a polymer and an acid labile group (ALG) linked to the polymer. The method includes exposing a portion of the resist layer to form an exposed region and an unexposed region and performing a baking process on the resist layer, so that the acid labile group cleaves from the polymer to form voids in the exposed region. The method also includes forming a first post treatment coating material over the exposed region and an unexposed region, and in the voids and removing a portion of the first post treatment coating material. Another portion of the first post treatment coating material is left on the top surface the exposed region and the top surface of the unexposed region. The method also includes removing the unexposed region, wherein another portion of the first post treatment coating material is left on the top surface of the exposed region.

In some embodiments, a method for performing a photolithography process is provided. The method includes forming a layer over a substrate, and exposing a portion of the layer to form an exposed region. The method also includes performing a baking process on the layer, so that voids are formed in the exposed region of the layer. The method further includes filling the void with a post treatment coating material, and the post treatment coating material is over the exposed region of the layer.

In some embodiments, a method for performing a photolithography process is provided. The method includes forming a resist layer over a substrate, and exposing a portion of the resist layer to form a first exposed region, a second exposed region and an unexposed region between the first exposed region and the second exposed region. The method includes performing a baking process on the resist layer, so that voids are formed in the first exposed region and the second exposed region. The method further includes forming a first coating material over the first exposed region, the second exposed region, and in the voids, and forming a second coating material on a sidewall of the first exposed region and a sidewall of the second exposed region.

In some embodiments, a method for performing a photolithography process is provided. The method includes forming a resist layer over a substrate, and the resist layer comprises a polymer and an acid labile group (ALG) linked to the polymer. The method includes exposing a portion of the resist layer to form an exposed region and an unexposed region, and performing a heating process on the resist layer, so that the acid labile group cleaves from the polymer to form voids in the exposed region. The method also includes forming a first coating material over the exposed region, an unexposed region and in the voids.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for performing a photolithography process, comprising:
    forming a layer over a substrate;
    exposing a portion of the layer to form an exposed region;
    performing a baking process on the layer, so that voids are formed in the exposed region of the layer, wherein the layer comprises a polymer and an acid labile group (ALG), and the ALG cleaves from the polymer when performing the baking process on the layer; and
    filling the void with a post treatment coating material, wherein the post treatment coating material is over the exposed region of the layer.

2. The method for performing the photolithography process as claimed in claim 1, further comprising:
    removing a portion of the post treatment coating material, such that sidewall surfaces and a top surface of the exposed region of the layer is covered by the first post treatment coating material.

3. The method for performing the photolithography process as claimed in claim 1, wherein the voids formed on an outer sidewall of the first exposed region are filled with the post treatment coating material.

4. The method for performing the photolithography process as claimed in claim 1, wherein the layer further comprises an unexposed region, and the post treatment coating material is formed on the unexposed region.

5. The method for performing the photolithography process as claimed in claim 1, wherein the post treatment coating material comprises a first segment and a second segment linked to the first segment, and the first segment is configured to form a physical bond or a chemical bond with the exposed region of the layer.

6. The method for performing the photolithography process as claimed in claim 5, wherein the first segment comprises a halogen atom, hydroxy group, amine group, sulfo group, or carboxyl group.

7. The method for performing the photolithography process as claimed in claim 5, wherein the second segment is configured to increase the etching resistance of the post treatment coating material, and the second segment comprises substituted or unsubstituted linear, branched, or cyclic hydrocarbon group, or substituted or unsubstituted aromatic group, and/or at least one hydrogen of the unsubstituted linear, branched, or cyclic hydrocarbon group is substituted by halogen, hydroxyl, sulfo or carboxyl.

8. The method for performing the photolithography process as claimed in claim 1, wherein the layer further comprises an unexposed region, and the unexposed region is removed before filling the void with the post treatment coating material.

9. A method for performing a photolithography process, comprising:
    forming a resist layer over a substrate;
    exposing a portion of the resist layer to form a first exposed region, a second exposed region and an unexposed region between the first exposed region and the second exposed region;
    performing a baking process on the resist layer, so that voids are formed in the first exposed region and the second exposed region;
    forming a first coating material over the first exposed region, the second exposed region, and in the voids; and
    forming a second coating material on a sidewall of the first exposed region and a sidewall of the second exposed region.

10. The method for performing the photolithography process as claimed in claim 9, further comprising:
    removing a portion of the first coating material by a first developer, wherein another portion of the first coating material is left on a top surface the first exposed region, a top surface of the second exposed region and a top surface of the unexposed region; and
    removing the unexposed region using a second developer, such that another portion of the first coating material is divided into two separated portions.

11. The method for performing the photolithography process as claimed in claim 10, wherein the first developer is different from the second developer.

12. The method for performing the photolithography process as claimed in claim 9, wherein the first coating material comprises a first segment and a second segment linked to the first segment, and the first segment is configured to form a physical bond or a chemical bond with the first exposed region and the second exposed region of the resist layer.

13. The method for performing the photolithography process as claimed in claim 9, wherein the resist layer comprises a polymer and an acid labile group (ALG), and the acid labile group cleaves from the polymer when performing the baking process on the resist layer.

14. The method for performing the photolithography process as claimed in claim 9, wherein the voids are formed on an outer sidewall of the first exposed region, and the outer sidewall of the first exposed region is covered by the first coating material.

15. A method for performing a photolithography process, comprising:
    forming a resist layer over a substrate, wherein the resist layer comprises a polymer and an acid labile group (ALG) linked to the polymer;
    exposing a portion of the resist layer to form an exposed region and an unexposed region;

performing a heating process on the resist layer, so that the acid labile group cleaves from the polymer to form voids in the exposed region; and forming a first coating material over the exposed region, an unexposed region and in the voids.

16. The method for performing the photolithography process as claimed in claim 15, further comprising:

removing a portion of the first coating material, wherein another portion of the first coating material continuously covers a top surface of the exposed region and a top surface of the unexposed region; and removing the unexposed region, such that another portion of the first coating material is divided into two separated portions.

17. The method for performing the photolithography process as claimed in claim 16, wherein the step of removing the portion of the first coating material is performed by a first developer, the step of removing the unexposed region is performed by a second developer, and the first developer is different from the second developer.

18. The method for performing the photolithography process as claimed in claim 16, wherein the first coating material comprises a first segment and a second segment linked to the first segment, and the first segment is configured to form a physical bond or a chemical bond with the exposed region of the resist layer.

19. The method for performing the photolithography process as claimed in claim 16, wherein the voids formed on an outer sidewall of the first exposed region are filled with the first coating material.

20. The method for performing the photolithography process as claimed in claim 1, further comprising:

performing a post treatment process onto the post treatment coating material, wherein the post treatment process comprises a radiation curing process, a thermal baking process or a combination thereof.

* * * * *